US010816896B2

(12) United States Patent
Sato

(10) Patent No.: US 10,816,896 B2
(45) Date of Patent: Oct. 27, 2020

(54) METHOD FOR MANUFACTURING IMPRINTING TEMPLATE SUBSTRATE, IMPRINTING TEMPLATE SUBSTRATE, IMPRINTING TEMPLATE, AND METHOD FOR MANUFACTURING SEMICONDUCTOR APPARATUS

(71) Applicant: TOSHIBA MEMORY CORPORATION, Tokyo (JP)

(72) Inventor: Nobuyoshi Sato, Mie (JP)

(73) Assignee: Toshiba Memory Corporation, Tokyo (JP)

( * ) Notice: Subject to any disclaimer, the term of this patent is extended or adjusted under 35 U.S.C. 154(b) by 909 days.

(21) Appl. No.: 15/066,758

(22) Filed: Mar. 10, 2016

(65) Prior Publication Data

US 2017/0038677 A1 Feb. 9, 2017

(30) Foreign Application Priority Data

Aug. 4, 2015 (JP) ................................. 2015-154413

(51) Int. Cl.
*G03F 7/00* (2006.01)
(52) U.S. Cl.
CPC .................... *G03F 7/0002* (2013.01)
(58) Field of Classification Search
CPC .................................................. G03F 7/0002
See application file for complete search history.

(56) References Cited

U.S. PATENT DOCUMENTS

| 2008/0303187 | A1 | 12/2008 | Stacey et al. |
| 2010/0264113 | A1 | 10/2010 | Yoneda et al. |
| 2012/0244286 | A1 | 9/2012 | Kobayashi |

FOREIGN PATENT DOCUMENTS

| JP | 9-31215 | 2/1997 |
| JP | 2006-274322 | 10/2006 |
| JP | 2008-20623 | 1/2008 |
| JP | 2012-204428 | 10/2012 |
| JP | 2014-14752 | 1/2014 |
| JP | 2014-177072 | 9/2014 |
| JP | 2014-239208 | 12/2014 |
| WO | WO 2002/067055 | * 8/2002 |

OTHER PUBLICATIONS

Sato, N., et al., "Adsorption Model of Organic Molecules on the Surface of Thermally Oxidized Silicon", ECS. J. Solid State Sci. Technol, vol. 1, Issue 4, pp. N61-N66 (2012).

* cited by examiner

*Primary Examiner* — Larry W Thrower
(74) *Attorney, Agent, or Firm* — Finnegan, Henderson, Farabow, Garrett & Dunner, L.L.P.

(57) ABSTRACT

A method for manufacturing an imprinting template substrate forms a protruded mesa portion by removing a part of the substrate, and forms a film containing silicon, carbon, and fluorine, on a side surface of the mesa portion. Even when the template is pressed to the resist, the resist barely adheres to the side surface of the template. Therefore, no defect that the resist having adhered to the side surface of the template falls on the wafer and then defective parts increase, occurs.

8 Claims, 6 Drawing Sheets

METHOD FOR MANUFACTURING IMPRINTING TEMPLATE SUBSTRATE, IMPRINTING TEMPLATE SUBSTRATE, IMPRINTING TEMPLATE, AND METHOD FOR MANUFACTURING SEMICONDUCTOR APPARATUS

CROSS REFERENCE TO RELATED APPLICATIONS

This application is based upon and claims the benefit of priority from the prior Japanese Patent Application No. 2015-154413, filed on Aug. 4, 2015, the entire contents of which are incorporated herein by reference.

FIELD

Embodiments of the present invention relate to a method for manufacturing an imprinting template substrate, an imprinting template substrate, an imprinting template, and a method for manufacturing a semiconductor apparatus.

BACKGROUND

An imprinting method has attracted attention as a technique for forming a fine pattern. In the imprinting method, an imprinting template including an uneven pattern formed thereon is contacted with resist coated on a base substrate. After the resist has cured, the template is released from the resist to form a resist pattern including the uneven pattern transferred to the base substrate. The base substrate is processed with the resist pattern as a mask so that a fine pattern is formed on the base substrate.

In the imprinting method, it is assumed that processing for forming the resist pattern on a wafer is repeated while the template is moved on the wafer.

The template is formed by, for example, processing quartz glass. More specifically, a protruded mesa portion is formed on the quartz glass. A fine uneven pattern is formed on an upper surface of the mesa portion. This uneven pattern is to be pressed to the resist. However, at a time point when the upper surface of the mesa portion of the template has been pressed to the resist, the resist has flexibility. Therefore, there is a risk that the resist extrudes from the mesa portion and climbs up a side surface of the mesa portion, because the resist has a high wettability on the surface of the quartz glass. The template is separated from the resist after the resist has cured. The resist that has climbed up the side surface of the mesa portion, remains adhering to the side surface. Accordingly, when processing for pressing the template to the resist is repeated, the amount of the resist that adheres to the side surface of the mesa portion gradually increases. After a while, the resist falls on the wafer at unintended timing so as to cause a large defect on the wafer.

DETAILED DESCRIPTION

According to one embodiment, a method for manufacturing an imprinting template substrate forms a protruded mesa portion by removing a part of the substrate, and forms a film containing silicon, carbon, and fluorine, on a side surface of the mesa portion.

Hereinafter, embodiments will be described with respect to drawings.

First Embodiment

Figure 1A:
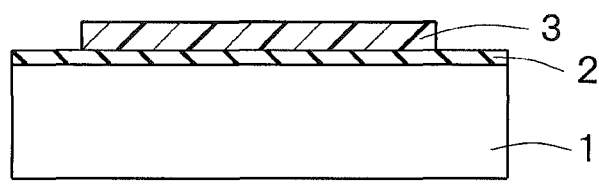
FIG. 1A is a cross-sectional view of a manufacturing process of an imprinting template according to a first embodiment.

FIGS. 1A to 1F are cross-sectional views of illustrating manufacturing processes of an imprinting template according to a first embodiment. First, a protective film 2 is formed on one main surface of a quartz glass substrate 1. Examples of the protective film 2 include $SiO_2$, SiON, SiN, and TiN. The thickness of the protective film 2 is, for example, approximately 50 to 100 nm. Next, as illustrated in FIG. 1A, a mask member 3 for forming a mesa portion, adheres to the protective film 2. The mask member 3 may be a resist film or a hard mask film.

Figure 1B:
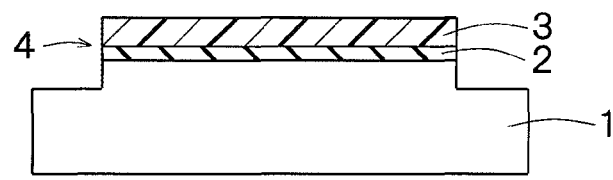
FIG. 1B is a cross-sectional view of a manufacturing process following the process illustrated in FIG. 1A.

Next, as illustrated in FIG. 1B, in a case where the protective film 2 includes an insulating film, such as $SiO_2$, SiON, or SiN, reactive ion etching (RIE) is performed using $CF_4$ or $CHF_3$ gas so as to remove a part of the protective film 2 along an outline of the mask member 3. In addition, a part of the quartz glass substrate 1 is removed by using a hydrofluoric acid so as to form the protruded mesa portion 4. Accordingly, the height of a side surface of the mesa portion 4 is designed to be approximately 30 µm. In a case where the protective film 2 includes a metal nitride film, such as TiN, a part of the protective film 2 is removed by using an ammonia-peroxide mixture (APM). After that, a part of the quartz glass substrate 1 is removed by using a hydrofluoric acid so as to form a protruded mesa portion 4.

Figure 1C:
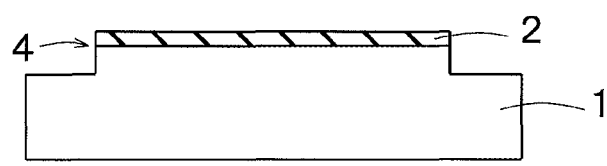
FIG. 1C is a cross-sectional view of a manufacturing process following the process illustrated in FIG. 1B.

Next, as illustrated in FIG. 1C, the mask member 3 that has adhered to an upper surface of the mesa portion 4 is removed by sulfuric acid hydrogen peroxide mixture (SPM) processing and $O_2$ ashing.

Figure 1D:
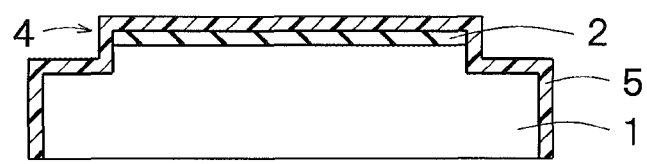
FIG. 1D is a cross-sectional view of a manufacturing process following the process illustrated in FIG. 1C.

Next, as illustrated in FIG. 1D, a silicon film 5 including polysilicon or amorphous silicon is formed on an entire surface of the quartz glass substrate 1. The silicon film 5 is formed so as to have substantially uniform film thickness on the surface of the quartz glass substrate 1. The film thickness is, for example, approximately 300 nm. Here, in a state where the inside of a chamber is set so as to have a predetermined degree of vacuum at a predetermined temperature, for example, $SIH_4$ gas or $Si_2H_6$ gas is introduced into the chamber so that the silicon film 5 including polysilicon or amorphous silicon is formed on the surface of the quartz glass substrate 1. Alternatively, a microwave may be applied into the chamber so that oxygen on the surface of the quartz glass is desorbed by a reduction reaction. Then, silicon may be exposed on the surface of the quartz glass substrate 1.

Figure 1E:
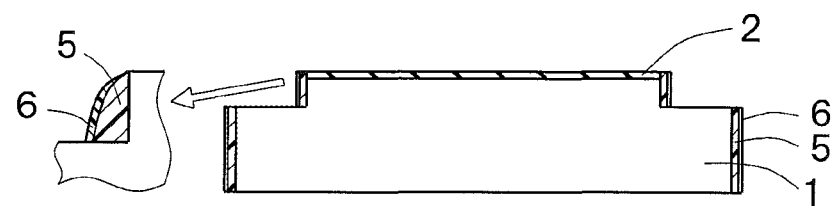
FIG. 1E is a cross-sectional view of a manufacturing process following the process illustrated in FIG. 1D.

Next, as illustrated in FIG. 1E, RIE is performed using a CF based gas containing carbon and fluorine (for example, $CF_4$, $C_2F_6$, or CHF). The RIE is anisotropic etching. The silicon film 5 on a surface parallel to a substrate surface of the quartz glass substrate 1, is removed. Then, the protective film 2 that is a base is exposed. Meanwhile, a part of the silicon film 5 on a side surface of the quartz glass substrate 1, is removed. Thus, a part of the silicon film 5 remains. On the left side in FIG. 1E, a structure of a side surface portion of the mesa portion 4 of the quartz glass substrate 1 is enlarged and illustrated. As illustrated, the etching progresses deeper toward the upper side of the side surface. Thus, a side wall in which the film thickness of the silicon film 5 becomes thinner upward, is formed. In addition, a film 6 containing silicon, carbon, and fluorine, is formed on a surface of the side wall portion. The film 6 is, for example, a film including silicon, carbon, and fluorine that have bonded together. A more specific example of the film 6 is an SiCFn (n=1, 2, or 3) film 6. The SiCFn film 6 has excellent water repellency and oil repellency. The SiCFn film 6 is also formed on the side surface of the quartz glass substrate 1 below the side surface of the mesa portion 4 in addition to the side surface of the mesa portion 4. In comparison, in a case where the protective film 2 that is the base is TiN, an etching rate of the RIE using the CF based gas decreases to 20% of that in a case where the protective film is the insulating film. Thus, the film thickness remains with substantially the initial film thickness.

Figure 1F:
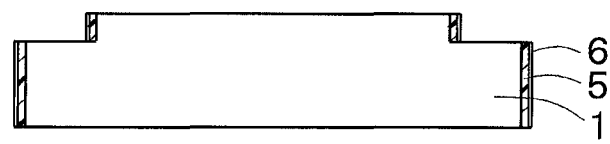
FIG. 1F is a cross-sectional view of a manufacturing process following the process illustrated in FIG. 1E.

Next, as illustrated in FIG. 1F, the protective film 2 that has remained on the upper surface of the mesa portion 4, is removed by using a hydrofluoric acid gas. In a case where the protective film 2 is TiN, the protective film 2 is removed by using the APM. However, the SiCFn film 6 on a side surface of a template remains.

Figure 1G:
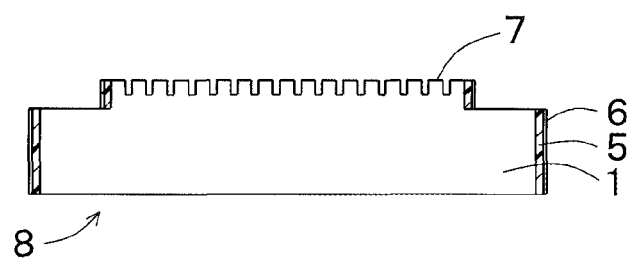
FIG. 1G is a cross-sectional view of a manufacturing process following the process illustrated in FIG. 1F.

With the above processes, the side surface of the template can be covered with the SiCFn film 6. After that, as illustrated in FIG. 1G, a fine uneven pattern 7 is formed on the upper surface of the mesa portion 4 by, for example, plasma etching. Then, the template is completed. When the template is pressed to resist coated on a wafer, since the SiCFn film 6 formed on the side surface of the template has the water repellency and oil repellency, the resist that has extruded to the outside of the template does not adhere to the SiCFn film 6.

In FIG. 1A, the mask member 3 is disposed on the one main surface of the quartz glass substrate 1 through the protective film 2. The mask member 3 may be directly disposed on the quartz glass substrate 1. The manufacturing processes in this case are illustrated in FIGS. 2A to 2F, for example.

Figure 2A:
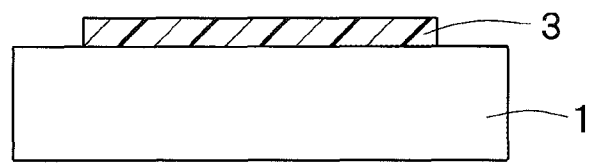
FIG. 2A is a cross-sectional view of a manufacturing process of an imprinting template according to one modification.
Figure 2B:
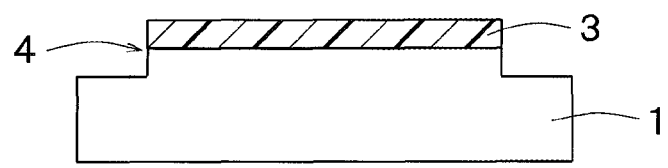
FIG. 2B is a cross-sectional view of a manufacturing process following the process illustrated in FIG. 2A.
Figure 2C:
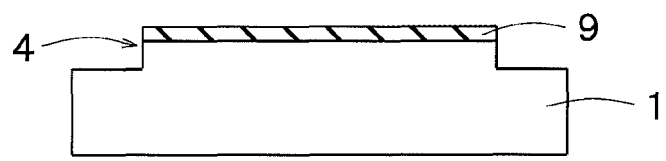
FIG. 2C is a cross-sectional view of a manufacturing process following the process illustrated in FIG. 2B.
Figure 2D:
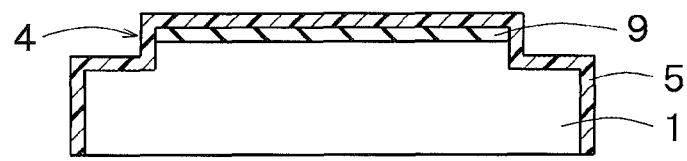
FIG. 2D is a cross-sectional view of a manufacturing process following the process illustrated in FIG. 2C.
Figure 2E:
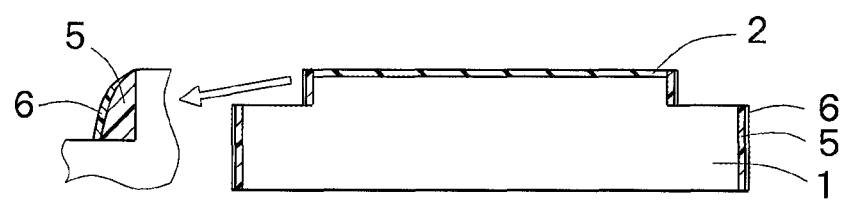
FIG. 2E is a cross-sectional view of a manufacturing process following the process illustrated in FIG. 2D.
Figure 2F:
FIG. 2F is a cross-sectional view of a manufacturing process following the process illustrated in FIG. 2E.

First, as illustrated in FIG. 2A, a mask member 3 including a resist film or a hard mask film adheres to a quartz glass substrate 1. Next, as illustrated in FIG. 2B, a part of the quartz glass substrate 1 is removed along an outline of the mask member 3, by using a hydrofluoric acid. Thus, a protruded mesa portion 4 is formed. Next, as illustrated in FIG. 2C, the mask member 3 that has adhered to an upper surface of the mesa portion 4 is removed by SPM processing and $O_2$ ashing. After that, a hard mask film 9 adheres to the upper surface of the mesa portion 4. The following processes (FIGS. 2D to 2F) are substantially the same as in FIGS. 1D to 1F. The descriptions of the following processes will be omitted.

An SiCFn film 6 can be formed on a side surface of a template 8 in any of manufacturing processes illustrated in FIGS. 1A to 1F and in FIGS. 2A to 2F. Here, a side surface of the template 8 includes the side surface of the mesa portion 4 and a second surface coupled to the side surface of the mesa portion 4 through a first surface. The RIE removes the silicon film 5 on the upper surface of the mesa portion 4 (formed surface of the uneven pattern 7) and the first surface. Therefore, the SiCFn film 6 is not formed on the upper surface of the mesa portion 4 and the first surface.

In FIGS. 1A to 1F and in FIGS. 2A to 2F, the silicon film 5 including polysilicon or amorphous silicon is used so as to form the SiCFn film 6. A contact angle of the SiCFn film 6 with respect to the resist varies depending on whether a base of the SiCFn film 6 is polysilicon or amorphous silicon.

Figure 3:
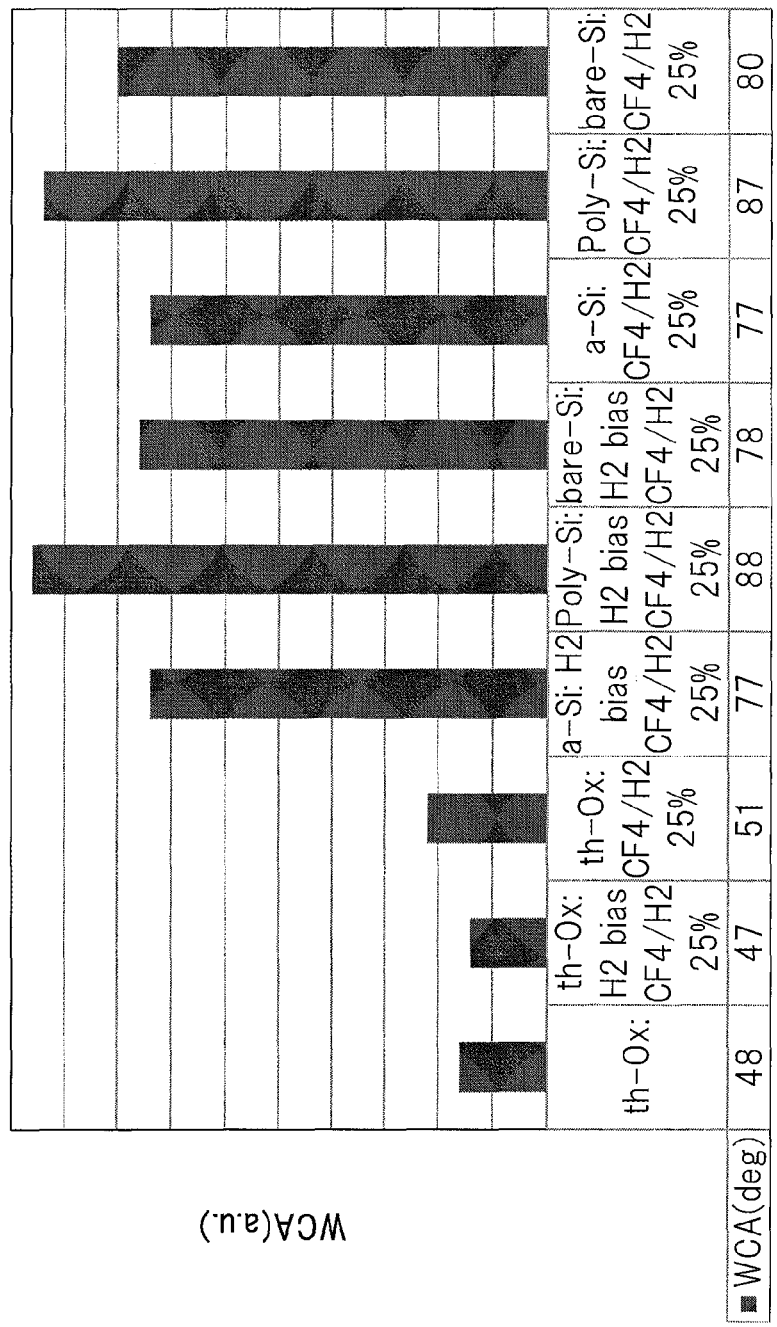
FIG. 3 is a graphical representation illustrating contact angles of a plurality of films each including a different material, with respect to resist.

FIG. 3 is a graphical representation of contact angles (water contact angle: WCA) of a plurality of films each including a different material, with respect to the resist. As can be seen in FIG. 3, a contact angle of polysilicon included in the base with respect to the resist is higher than those of amorphous silicon and bare silicon each included in the base with respect to the resist by approximately 10 to 15%. Therefore, in order to improve the water repellency and oil repellency, polysilicon is preferably used as the base. Note that, as can be seen in FIG. 3, even when the base is amorphous silicon, the water repellency and oil repellency can be further improved than that in a case where the base is an oxide film. Therefore, using amorphous silicon can also improve the water repellency and oil repellency.

Accordingly, according to the first embodiment, the SiCFn film 6 having excellent water repellency and oil repellency is formed on the side surface of the quartz glass substrate 1 that is a base member of the imprinting template 8. Therefore, even when the template 8 is pressed to the resist, the resist barely adheres to the side surface of the template 8. Therefore, no defect that the resist having adhered to the side surface of the template 8 falls on the wafer and then defective parts increase, occurs. There are the other advantageous effects of forming the Si-CFn film on polysilicon or amorphous silicon. For example, silicon has a low transmissivity to an ultraviolet. It is possible to prevent the breaking of a chemical bonding of Si-CFn on silicon due to the ultraviolet at the exposure time. Therefore, it is possible to stably keep the adherence of the resist for a long time.

Second Embodiment

According to a second embodiment, a CF based polymer layer 10 containing carbon and fluorine is formed without forming a silicon film 5 including polysilicon or amorphous silicon on a surface of quartz glass.

Figure 4A:
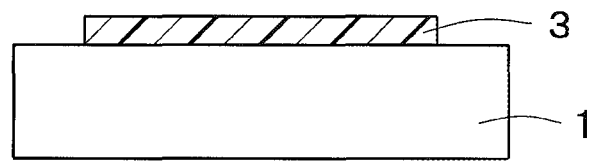
FIG. 4 A is a cross-sectional view of a manufacturing process of an imprinting template according to a second embodiment.
FIG. 4B is a cross-sectional view of a manufacturing process following the process illustrated in FIG. 4A.
FIG. 4C is a cross-sectional view of a manufacturing process following the process illustrated in FIG. 4B.
Figure 4B:
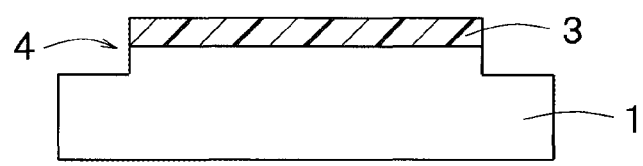
Figure 4C:
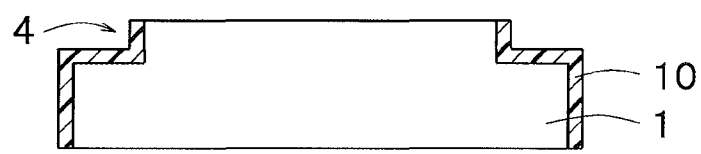

FIGS. 4A to 4C are cross-sectional views of manufacturing processes of an imprinting template 8 according to the second embodiment. First, as illustrated in FIG. 4A, a mask member 3 including a resist film or a hard mask film adheres to a quartz glass substrate 1. Next, as illustrated in FIG. 4B, a part of the quartz glass substrate 1 is removed along an outline of the mask member 3. Thus, a protruded mesa portion 4 is formed.

Next, as illustrated in FIG. 4C, a chamber that has been heated at 200° C. houses the quartz glass substrate 1. Then, a CF based solvent is vaporized in the chamber. Accordingly, the CF based polymer layer 10 containing carbon and fluorine is formed on a surface of the quartz glass substrate 1. Next, the mask member 3 is removed. After that, a fine pattern is formed on an upper surface of the mesa portion 4. Thus, the template 8 is completed.

In the template 8 according to the second embodiment, the CF based polymer layer 10 is directly formed on the surface of the quartz glass. Thus, oxygen in the quartz glass, carbon and fluorine in the CF based polymer layer 10, bond together. It can be thought that the strength of the bond is weaker than that of the bond of silicon, carbon, and fluorine included in the SiCFn film 6 according to the first embodiment. Therefore, there is a risk that the CF based polymer layer 10 that has adhered to a side surface of the template 8 according to the second embodiment easily comes off when compared to the SiCFn layer according to the first embodiment. However, since the CF based polymer layer 10 itself has water repellency and oil repellency, resist barely adheres to the side surface of the template 8 as far as the CF based polymer layer 10 has adhered to the side surface of the template 8.

Accordingly, according to the second embodiment, the CF based polymer layer 10 is formed on the surface of the quartz glass that is a base member of the imprinting template 8. Therefore, the side surface of the template 8 can have the water repellency and oil repellency by a manufacturing method simpler than that according to the first embodiment.

With each of the imprinting templates 8 according to the first and second embodiments, processing for causing the side surface of the template 8 to have the above water repellency and oil repellency, can be performed during a process for forming the protruded mesa portion 4 by processing the quartz glass by a glass manufacturer, for example. Accordingly, a master of the template 8 delivered from the glass manufacturer, includes its side surface to which water repellent and oil repellent processing has been already performed. Thus, there is no need for making any change in the following process. The template 8 to which resist barely adheres can be manufactured. With each of the imprinting templates 8 according to the first and second embodiments, a pattern formed on the template 8 is transferred to resist coated on a semiconductor substrate. The semiconductor substrate is processed based on the resist pattern that has been transferred. Therefore, it is possible to manufacture a semiconductor apparatus capable of reducing defect occurrence.

EXAMPLES

Example 1

A quartz glass 15-centimeter square was housed in a chamber held with a degree of vacuum of 30 Pa at a substrate temperature of 150° C. In this state, $SiH_4$ gas with a flow rate of 100 sccm was introduced into the chamber. Next, a microwave of 2.45 GHz was irradiated to the quartz glass. A silicon film 5 including polysilicon was formed on a surface of the quartz glass. Next, the $SiH_4$ gas was changed to $CF_4$ gas in the chamber and a flow rate of 50 sccm was set. An SiCFn film 6 was formed on a surface of the silicon film 5. A contact angle of the SiCFn (n=1, 2, or 3) film 6 was 65 deg with respect to resist.

Meanwhile, a silicon film 5 including amorphous silicon was formed instead of the polysilicon. A contact angle of an SiCFn film 6 formed on a surface of the silicon film 5 was 35 deg with respect to the resist.

Example 2

A quartz glass 15-centimeter square was housed in a chamber held with a degree of vacuum of 30 Pa at a substrate temperature of 400° C. In this state, $SiH_4$ gas with a flow rate of 100 sccm was introduced into the chamber. Next, a microwave of 2.45 GHz was irradiated to the quartz glass. A silicon film 5 including polysilicon was formed on a surface of the quartz glass. Next, the $SiH_4$ gas was changed to $CF_4$ gas in the chamber and a flow rate of 50 sccm was set. An SiCFn film 6 was formed on a surface of the silicon film 5. A contact angle of the SiCFn film 6 was 70 deg with respect to resist.

Meanwhile, a silicon film 5 including amorphous silicon was formed instead of the polysilicon. A contact angle of an SiCFn film 6 formed on the silicon film 5 was 40 deg with respect to the resist.

Example 3

A quartz glass 15-centimeter square was housed in a chamber held with a degree of vacuum of 300 Pa at a substrate temperature of 500° C. In this state, $Si_2H_6$ gas with a flow rate of 300 sccm was introduced into the chamber. Next, a silicon film 5 including polysilicon was formed on a surface of the quartz glass by thermal excitation. Next, the $Si_2H_6$ gas was changed to $CF_4$ gas in the chamber and a flow rate of 50 sccm was set. An SiCFn film 6 was formed on a surface of the silicon film 5. A contact angle of the SiCFn film 6 was 73 deg with respect to resist.

Meanwhile, a silicon film 5 including amorphous silicon was formed instead of the polysilicon. A contact angle of an SiCFn film 6 formed on a surface of the silicon film 5 was 43 deg with respect to the resist.

Example 4

A quartz glass 15-centimeter square was housed in a chamber held with a degree of vacuum of 300 Pa at a substrate temperature of 500° C. In this state, $Si_2H_6$ gas with a flow rate of 300 sccm was introduced into the chamber. Next, a silicon film 5 including polysilicon was formed on a surface of the quartz glass by thermal excitation. Next, the $Si_2H_6$ gas was changed to $C_2F_6$ gas in the chamber and a flow rate of 50 sccm was set. An SiCFn film 6 was formed on a surface of the silicon film 5. A contact angle of the SiCFn film 6 was 77 deg with respect to resist.

Meanwhile, a silicon film 5 including amorphous silicon was formed instead of the polysilicon. A contact angle of an SiCFn film 6 formed on a surface of the silicon film 5 was 47 deg with respect to the resist.

Example 5

A quartz glass 15-centimeter square was housed in a chamber held with a degree of vacuum of 30 Pa at a substrate temperature of 500° C. In this case, $H_2$ gas with a flow rate of 200 sccm was introduced into the chamber. Next, a microwave of 2.45 GHz was irradiated to the quartz glass. A high-density silicon film 5 was formed by desorbing oxygen from a surface of the glass by a reduction reaction. Next, the $H_2$ gas was changed to $CF_4$ gas in the chamber and a flow rate of 50 sccm was set. An SiCFn film 6 was formed on a surface of the silicon film 5. A contact angle of the SiCFn film 6 was 65 deg with respect to resist.

Meanwhile, a silicon film 5 including amorphous silicon was formed instead of polysilicon. A contact angle of an SiCFn film 6 formed on a surface of the silicon film 5 was 45 deg with respect to the resist.

Example 6

In each of Examples 1 to 4 that have been described above, upon formation of the SiCFn film 6, etch back was performed to the silicon film 5 on the surface of the quartz glass by using the $CF_4$ gas or the $C_2F_6$ gas to be supplied to the chamber. Thus, the SiCFn film 6 remained only on a side surface of the quartz glass. It was confirmed that the amount of resist that adhered to the side surface of the quartz glass decreased.

Example 7

A quartz glass 15-centimeter square was housed in a chamber held with a degree of vacuum of 30 Pa at a substrate temperature of 150° C. In this state, a microwave of 2.45 GHz was irradiated to the quartz glass and $CF_4$ gas was introduced into the chamber. Accordingly, a CF based polymer layer 10 was formed on a surface of the quartz glass. A contact angle of the CF based polymer layer 10 was 25 deg with respect to resist.

Example 8

A quartz glass 15-centimeter square was housed in a chamber held with a degree of vacuum of 30 Pa at a substrate temperature of 500° C. In this state, a microwave of 2.45 GHz was irradiated to the quartz glass and $C_2F_6$ gas was introduced into the chamber. Accordingly, a CF based polymer layer 10 was formed on a surface of the quartz glass. A contact angle of the CF based polymer 10 was 20 deg with respect to resist.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. An imprinting template substrate comprising:
   a quartz glass substrate having a protruded mesa portion;
   a silicon layer which comprises a material containing polysilicon or amorphous silicon, on a side surface of the mesa portion, the material being different from a material of the quartz glass substrate; and
   a film containing silicon, carbon, and fluorine on the silicon layer.

2. The template substrate according to claim 1, wherein the film comprises a film in which silicon, carbon, and fluorine are bonded together.

3. The template substrate according to claim 1, wherein the film is an SiCFn film, where n is 1, 2, or 3.

4. The template substrate according to claim 1, further comprising:
   a first surface coupled to the side surface of the mesa portion, and disposed in a direction substantially parallel to an upper surface of the mesa portion; and
   a second surface coupled to the first surface, and disposed in a direction intersecting with the first surface,
   wherein the film is disposed on the side surface of the mesa portion and on the second surface, and
   a material of the quartz glass substrate is exposed on the first surface.

5. An imprinting template comprising:
   a quartz glass substrate having a protruded mesa portion;
   a silicon layer which comprises a material containing polysilicon or amorphous silicon, on a side surface of the mesa portion, the material being different from a material of the quartz glass substrate;
   a film containing silicon, carbon, and fluorine on the silicon layer; and
   a pattern on an upper surface of the protruded mesa portion.

6. The template according to claim 5, wherein the film comprises a film in which silicon, carbon, and fluorine are bonded together.

7. The template according to claim 5, wherein the film is an SiCFn film, where n is 1, 2, or 3.

8. The template according to claim 5, further comprising:
   a first surface coupled to the side surface of the mesa portion, and disposed in a direction substantially parallel to an upper surface of the mesa portion; and
   a second surface coupled to the first surface, and disposed in a direction intersecting with the first surface,
   wherein the film containing silicon, carbon, and fluorine is disposed on the side surface of the mesa portion and on the second surface, and
   a material of the quartz glass substrate is exposed on the first surface.

* * * * *